(12) United States Patent
Ikeda

(10) Patent No.: US 8,854,125 B2
(45) Date of Patent: Oct. 7, 2014

(54) LINEAR AMPLIFIER THAT PERFORM LEVEL SHIFT AND METHOD OF LEVEL SHIFTING

(71) Applicant: Megachips Corporation, Yodogawa-ku (JP)

(72) Inventor: Takashi Ikeda, Chiba (JP)

(73) Assignee: MegaChips Corporation, Yodogawa-ku (JP)

(*) Notice: Subject to any disclaimer, the term of this patent is extended or adjusted under 35 U.S.C. 154(b) by 76 days.

(21) Appl. No.: 13/708,309

(22) Filed: Dec. 7, 2012

(65) Prior Publication Data
US 2013/0147548 A1    Jun. 13, 2013

(30) Foreign Application Priority Data

Dec. 9, 2011    (JP) ................. 2011-269866

(51) Int. Cl.
*H03F 3/45*    (2006.01)
*H03G 3/20*    (2006.01)
*H03F 1/34*    (2006.01)

(52) U.S. Cl.
CPC ........ *H03F 1/34* (2013.01); *H03F 2203/45101* (2013.01); *H03F 2203/45526* (2013.01); *H03F 3/45475* (2013.01); *H03F 2203/45138* (2013.01); *H03F 2203/45591* (2013.01)
USPC ........................................... 330/69; 330/144

(58) Field of Classification Search
CPC .................... H03F 3/45; H03G 3/20
USPC ..................... 330/69, 144, 258; 327/333
See application file for complete search history.

(56) References Cited

U.S. PATENT DOCUMENTS

| 7,528,659 | B2 | 5/2009 | Yokoyama et al. |
| 7,750,737 | B2 | 7/2010 | Srinivasa et al. |
| 8,054,208 | B2* | 11/2011 | Fletcher et al. ............... 341/141 |

FOREIGN PATENT DOCUMENTS

| JP | A-2001-244760 | 9/2001 |
| JP | A-2002-344258 | 11/2002 |
| JP | A-2005-323287 | 11/2005 |

* cited by examiner

*Primary Examiner* — Steven J Mottola
(74) *Attorney, Agent, or Firm* — Oblon, Spivak, McClelland, Maier & Neustadt, L.L.P.

(57) ABSTRACT

A linear amplifier that comprises a signal input terminal that receives an input signal having a first common mode voltage, a voltage amplifier having a non-inverting input terminal that receives a second common mode voltage, a first and a second input resistance connected in series from the signal input terminal to the inverting input terminal of the voltage amplifier, a feedback resistance connected between the inverting input terminal and the output terminal of the voltage amplifier, and a constant current source. The constant current source supplies a constant current to a middle node between the first and the second input resistances. The constant current generates a voltage drop, which is equal to a difference between the first and the second common mode voltages, across the first input resistance. Accordingly, the common mode voltage of the output signal is directly determined by the second common mode voltage.

19 Claims, 6 Drawing Sheets

MN1:MN2=R1a:Ra=1:n

Related Art

LINEAR AMPLIFIER THAT PERFORM LEVEL SHIFT AND METHOD OF LEVEL SHIFTING

This application claims benefit of Japanese Application No. JP-A-2011-269866. The disclosure of the prior application is hereby incorporated by reference in its entirety.

BACKGROUND

This disclosure relates to linear amplifiers having level shift function with small circuit areas and low power consumptions. The linear amplifiers may also have variable gain and low-pass filter functions.

Circuits such as shown in FIG. 8 that perform level shifts while keeping linearity of analog signals are known. See, for example, Japanese patent publication JP 2001-244760. In the level shift circuit shown in FIG. 6, the input voltage signal Vin is an output signal of the preceding stage circuit that operates with a first power supply voltage VDD1. The following stage circuit, which includes the voltage amplifier or an operational amplifier 11, operates with a second power supply voltage VDD2, which is different from VDD1.

The input signal Vin is input to an inverting input terminal of the voltage amplifier 11 through an input resistance R1. Moreover, a reference voltage Vref is input to a non-inverting input terminal, and the output signal Vout is fed back to the inverting input terminal of the voltage amplifier through a feedback resistance R2. As a result, assuming that the gain of the voltage amplifier 11 is sufficiently large, the voltage at the inverting input terminal becomes equal to the reference voltage Vref. Accordingly, a current Ib defined by the following equation flows through the input resistance R1.

$$Ib=(Vin-Vref)/R1$$

The current Ib also flows through the feedback resistance R2, and a voltage of the output signal voltage Vout is defined as follows.

$$Vout = Vref - R2 \cdot Ib$$
$$= Vref - [R2 \cdot (Vin - Vref)/R1]$$

As a result, an average voltage, or a common mode voltage, of the output signal Vout can be controlled by the common mode voltage of the input signal Vin and the reference voltage Vref. That is, a level shift, or a level down, of the signal is accomplished.

Consider, for example, the following case: a level shift from a signal in a first region with 3.3 V supply voltage to a signal in a second region with 1.2 V supply voltage, the reference voltage Vref=1.0 V, the input common mode voltage Vin_common=1.5V, and the resistances R1=R2=500 Ω.

In this case, an average of the current, or DC current, flowing through the resistances R1 and R2 is 1 mA, and the output common mode voltage Vout_common becomes 0.5 V. That is, a −1.0 V level shift is performed. Assuming that the gain of the voltage amplifier is sufficiently large, the gain Av of the circuit is defined as follows.

$$Av=R2/R1=1$$

Thus, amplitude of the input signal Vin is maintained in the output signal Vout.

It would be easy to understand the operation of the linear amplifier shown in FIG. 6 by imagining a movement of seesaw with arms having lengths of R1 and R2, respectively, from the fulcrum. See FIG. 7. When an input signal Vin at the end of the input resistance R1 moves around a higher common mode voltage, an output signal Vout at the end of the feedback resistance R2 moves around a lower common mode voltage Vout_common.

It is also possible to generate an output signal with a higher common mode voltage from an input signal with a lower common mode voltage. In this case, DC current flows toward the input signal side Vin through the resistances R1 and R2.

FIG. 9 shows another known level shift circuit disclosed in Japanese patent publication JP-2002-344258. The circuit shown in FIG. 9 includes, in addition to the same circuit components constituting the circuit shown in FIG. 6, a constant current source 23 connected between the inverting input terminal of the voltage amplifier 11 and the ground. The constant current source 23 draws a current Ic.

The circuit shown in FIG. 9 operates same as the circuit shown in FIG. 6 when the constant current source 23 is not connected. On the other hand, when the constant current source 23 is connected and if Vin_common=Vref, the current Ic flows in the feedback resistance R2. In this case, the output common mode voltage Vout_common is determined as follows.

$$Vout\_common=Vref+Ic \cdot R2$$

Thus, the level shift circuit shown in FIG. 9 performs level shift, or level up, to generate output signal Vout from input signal Vin by using the reference voltage Vref.

In the level shift circuit shown in FIG. 6, however, it is required to generate a reference voltage Vref appropriate for the input common mode voltage Vin_common and the output common mode voltage Vout_common. Further, the input resistance R1 and the reference voltage Vref determine the additional current Ib, which is required to drive the voltage amplifier 11. Accordingly, it becomes necessary to modify the construction of voltage amplifier 11 when one of the input resistance R1 and the reference voltage Vref varies.

Further, in the level shift circuit shown in FIG. 6, it is difficult to increase the amount of level shift because the reference voltage is used as a fulcrum. As an example, consider a case of level shift from an input signal in the 3.3 V supply voltage region with the common mode voltage of 2.5 V to an output signal in the 1.2 V supply voltage region. If the voltage amplifier 11 is placed in the 1.2 V supply voltage region, the reference voltage Vref cannot become higher than 1.2 V. As a result, the common mode voltage of the output signal Vout_common is equal to or lower than −0.1V, which cannot be realized conventionally.

Accordingly, it is necessary to construct the level shift circuit with a voltage amplifier placed in the 3.3 V supply voltage region. When the reference voltage Vref is set to 1.5 V, for example, the output common mode voltage Vout_common becomes 0.5 V.

However, such solution has some drawbacks. For example, the voltage amplifier in the 3.3 V supply voltage region may increase the power consumption. Further, the output stage of the voltage amplifier in the 3.3 V supply voltage region cannot operate when the required output common mode voltage Vout_common becomes too low. Accordingly, two stages of level shift circuits in both the 3.3 V and 1.2V supply voltage regions may be required.

The two stage level shift may become unnecessary if the ratio of the resistances R1 and R2 is carefully selected. In this case, however, the amplitude of the signal decreases because the total gain of the linear amplifier is defined by the ratio of R2/R1.

The reference voltage Vref may be generated from the input common mode voltage Vin_common and the output common mode voltage Vout_common. For example, as shown in FIG. 8, the difference between the input common mode voltage Vin_common and the output common mode voltage Vout_common, which are buffered by respective voltage followers constructed with voltage amplifiers 12 and 13, may be divided by resistances R21 and R22. Here, the ratio between the resistances R21 and R22 may be set as R21:R22=R1:R2.

Moreover, the level shift circuits shown in FIGS. 6 and 9 cannot directly determine the output common mode voltage Vout_common. In the circuit shown in FIG. 6, the combination of the common mode voltage of the input signal Vin_common, the reference voltage Vref, the input resistance R1, and the feedback resistance R2 determines the output common mode voltage Vout_common. In the circuit shown in FIG. 9, the combination of the common mode voltage of the input signal Vin_common, the current Ic of the constant current source 23, and the feedback resistance R2 determines the output common mode voltage Vout_common.

That is, in neither of these circuits, the output common mode voltage Vout_common is determined by a single parameter. Furthermore, when the level shift circuit shown in FIG. 9 is constructed in a semiconductor integrated circuit, the feedback resistance R2 inevitably has a large variation. As a result, the output common mode voltage Vout_common also has a large variation. In other words, the output common mode voltage cannot be determined precisely.

SUMMARY

It would be advantageous to provide a linear amplifier, and a method of level shifting, capable of performing a large amount of level shift, which may be a level up or a level down.

It would be also advantageous to provide a linear amplifier, and a method of level shifting, capable of precisely determining the amount of level shift.

Aspects of this disclosure provide a linear amplifier that includes a constant current source that supplies a constant current to a node between a first and a second input resistance connected in series from a signal input terminal to an inverting input terminal of a voltage amplifier. The constant current generates a voltage drop equal to a difference between a first and a second common mode voltage across the first input resistance. Aspects of this disclosure also provide a method of level shifting which includes supplying a constant current to a node between a first and a second input resistance. Accordingly, a level shift is accomplished in the first input resistance, and a large amount of level shift, which may be a level down or a level down, is enable.

In an embodiment, the constant current sources may include a current generating resistance connected between the first and second common mode voltages to generate a source current, and a current mirror circuit that mirrors the source current to generate the constant current. The supplying of the constant current may include generating a source current by connecting a current generating resistance between the first and second common mode voltages, and mirroring the source current to generate the constant current. Accordingly, the amount of level shift is precisely determined even when the value of the first input resistance varies.

Aspects of this disclosure provide a linear amplifier that includes a signal input terminal that receives an input signal having a first common mode voltage, a voltage amplifier having an inverting input terminal, a non-inverting input terminal, and an output terminal that outputs an output signal. The linear amplifier also includes a first and a second input resistance connected in series from the signal input terminal to the inverting input terminal of the voltage amplifier, and a feedback resistance connected between the inverting input terminal and the output terminal of the voltage amplifier. The non-inverting input terminal of the voltage amplifier is supplied with a second common mode voltage. The linear amplifier further includes a constant current source that supplies a constant current to a middle node between the first and second input resistances. The constant current generates a voltage drop, which is equal to a difference between the first and second common mode voltages, across the signal input terminal and the middle node.

Aspects of this disclosure provide a linear amplifier that includes a positive and a negative signal input terminal that receive a differential input signal having a first common mode voltage, and a voltage amplifier having a non-inverting and an inverting input terminal and a non-inverting and an inverting output terminal that output a differential output signal. The linear amplifier also includes a first and a second positive input resistance connected in series from the positive signal input terminal to the non-inverting input terminal of the voltage amplifier and a first and a second negative input resistance connected in series from the negative signal input terminal to the inverting input terminal of the voltage amplifier, and a first feedback resistance connected between the inverting input terminal and the non-inverting output terminal of the voltage amplifier and a second feedback resistance connected between the non-inverting input terminal and the inverting output terminal of the voltage amplifier. The linear amplifier further includes a constant current source that supplies a first constant current to a first middle node between the first and second positive input resistances and a second constant current to a second middle node between the first and second negative input resistances so that a voltage drop, which is equal to a difference between the first common mode voltage and a second common mode voltage, is generated across the positive signal input terminal and the first middle node and across the negative input terminal and the second middle node.

In an embodiment, the voltage amplifier includes a common mode feedback circuit that controls a common mode voltage of the differential output signal equal to the second common mode voltage.

Aspects of this disclosure provide a method of level shifting that includes receiving an input signal having an input common mode voltage equal to a first common mode voltage at a signal input terminal. The method also includes inputting the input signal to an inverting input terminal of a voltage amplifier through a first and a second input resistance connected in series from the signal input terminal to the inverting input terminal, supplying a second common mode voltage to a non-inverting input terminal of the voltage amplifier, outputting an output signal from an output terminal of the voltage amplifier, and feeding back the output signal to the inverting input terminal of the voltage amplifier through a feedback resistance. The method further includes supplying a constant current to a middle node between the first and second input resistances to generate a voltage drop, which is equal to a difference between the first and second common mode voltages, across the signal input terminal and the middle node so that the input signal is input to the inverting input terminal of the voltage amplifier through the second input resistance after the input common mode voltage is shifted to the second common mode voltage.

Aspects of this disclosure further provide a method of level shifting that includes receiving a differential input signal including a positive and a negative input signal, which has an input common mode voltage equal to a first common mode voltage, at a positive and a negative signal input terminal, respectively, and inputting the positive input signal to a non-inverting input terminal of a voltage amplifier through a first and a second positive input resistance connected in series from the positive signal input terminal to the non-inverting input terminal and the negative input signal to an inverting input terminal of the voltage amplifier through a first and a second negative input resistance connected in series from the negative signal input terminal to the inverting input terminal. The method also includes outputting a differential output signal including a positive and a negative output signal from a non-inverting and an inverting output terminal, respectively, of the voltage amplifier, and feeding back the positive output signal to the inverting input terminal of the voltage amplifier through a first feedback resistance and the negative output signal to the non-inverting input terminal of the voltage amplifier through a second feedback resistance. The method further includes supplying a first constant current to a first middle node between the first and second positive resistances and a second constant current to a second middle node between the first and second negative resistances, and generating a voltage drop, which is equal to a difference between the first common mode voltage and a second common mode voltage, across the positive signal input terminal and the first middle node and across the negative signal input terminal and the second middle node so that the positive and negative input signals are input to the non-inverting and inverting input terminals of the voltage amplifier through the second positive and second negative input resistances, respectively, after the input common mode voltage is shifted to the second common mode voltage.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Exemplary linear amplifiers and exemplary methods of level shifting according to this disclosure will be explained with reference to preferred embodiments shown on attached drawings.

Basic Construction

Figure 1:
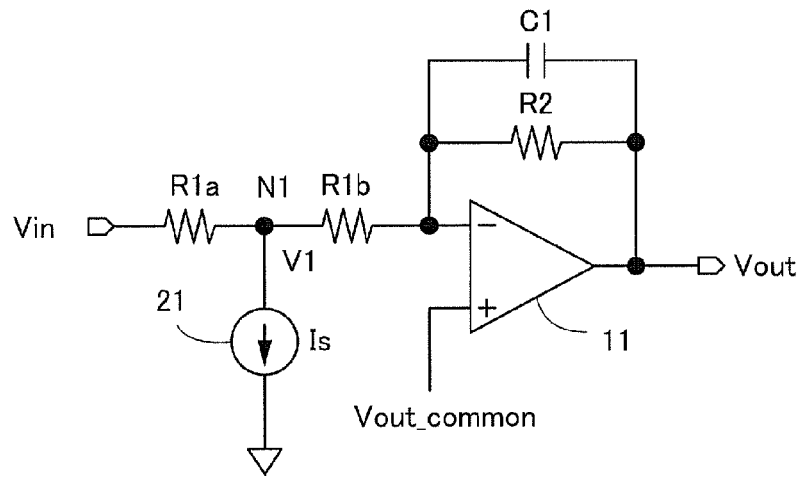
FIG. 1 shows basic construction of an exemplary linear amplifier according to this disclosure.

FIG. 1 shows basic construction of an exemplary linear amplifier according to this disclosure. Here, the input resistance R1 connected between the signal input terminal of the exemplary linear amplifier, which receives the input signal Vin, and the inverting input terminal of the voltage amplifier 11 is divided into input resistances R1$a$ and R1$b$. A constant current source 21 that draws a current Is, or supplies the current −Is, is connected to the node between the divided input resistances R1$a$ and R1$b$. A feedback resistance R2 and a feedback capacitance C1, which are connected in parallel with each other, are connected between the inverting input terminal and the output terminal of the voltage amplifier 11. The output terminal of the voltage amplifier 11 acts as an output terminal of the exemplary linear amplifier to output the output signal Vout. Further, in order to control the common mode voltage of the output signal Vout, a voltage Vout_common is supplied to the non-inverting input terminal of the voltage amplifier 11.

In the exemplary linear amplifier shown in FIG. 1, because the resistance R1$a$ and the current Is shifts the level of input signal Vin, DC current flows only through the resistance R1$a$. Accordingly, values of the resistances R1$b$ and R2 do not influence the amount of level shift. As a result, it is possible to realize a variable gain amplifier by changing the values of the resistances R1$b$ and R2 while accomplishing a fixed amount of level shift.

Figure 6:
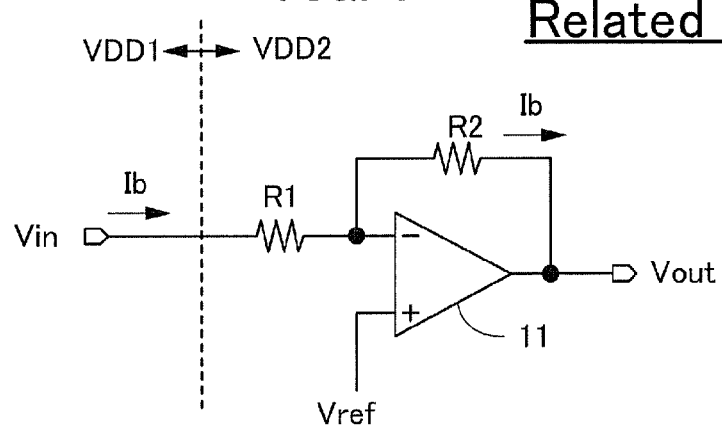
FIG. 6 shows a circuit diagram of a conventional linear amplifier.
Figure 7:
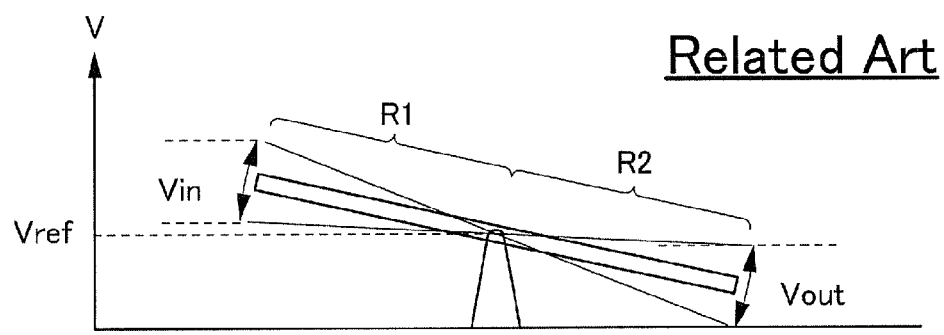
FIG. 7 shows an image of the operation of the conventional linear amplifier shown in FIG. 6.
Figure 8:
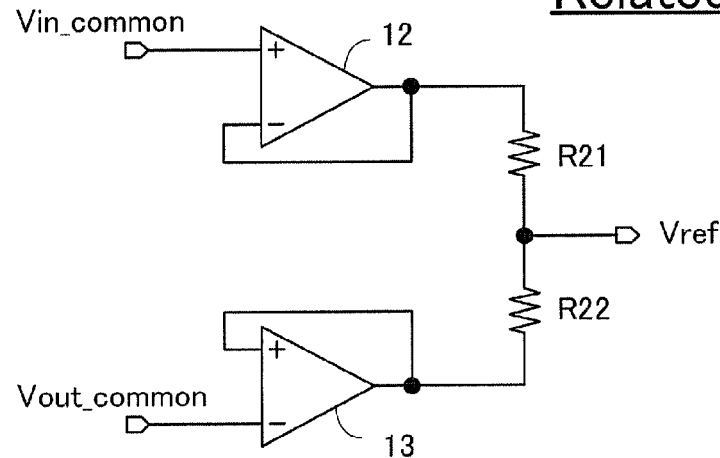
FIG. 8 shows a circuit diagram of an exemplary reference voltage generating circuit that supplies the reference voltage Vref to the linear amplifier shown in FIG. 6.
Figure 9:
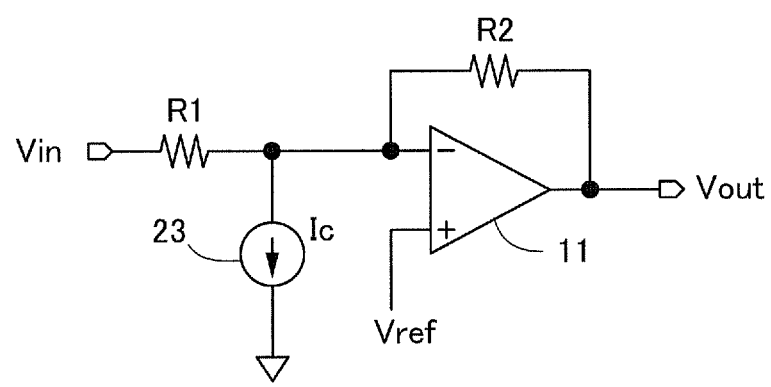
FIG. 9 shows a circuit diagram of another conventional linear amplifier.

In the conventional linear amplifier such as shown in FIG. 6, on the other hand, values of the resistances R1 and R2 influence both the gain and the amount of level shift. Accordingly, it is impossible to realize a variable gain amplifier with a fixed amount of level shift.

In the exemplary linear amplifier shown in FIG. 1, an amount of level shift Voffset, or a difference between common mode voltages of the input signal Vin and the output signal Vout, is determined as follows.

$$V\text{offset} = I_s \cdot R1a$$

The AC gain Av of the exemplary linear amplifier, or a ratio of amplitudes of the output signal Vout and the input signal Vin, is determined by the following equation.

$$Av = R2/(R1a + R1b)$$

Further, the exemplary linear amplifier may construct a low-pass filter by connecting the feedback capacitance C1 in parallel with the feedback resistance R2. The cut-off frequency of the low-pass filter is determined by the following equation.

$$fp = 1/(2\pi \cdot R2 \cdot C1)$$

In the exemplary liner amplifier shown in FIG. 1, by appropriately setting the current Is, an average voltage V1 at the middle node N1 between the resistances R1$a$ and R1$b$ is controlled as follows.

$$V1 = V\text{out\_common}$$

That is, the input signal Vin is input to the voltage amplifier 11 through the resistance R1$b$ after the common mode voltage thereof is shifted to Vout_common. Further, because the voltage Vout_common is supplied to the non-inverting input terminal and the output signal Vout is fed back to the inverting input terminal through the feedback resistance R2, the voltage at the inverting input terminal of the voltage amplifier 11 is fixed to the voltage Vout_common. As a result, DC current flowing in the resistances R1$b$ and R2 can be cancelled, i.e., no DC current flows in the resistances R1$b$ and R2. Accordingly, the common mode voltage of the output signal Vout becomes equal to the voltage Vout_common.

1st Exemplary Embodiment

Figure 2:
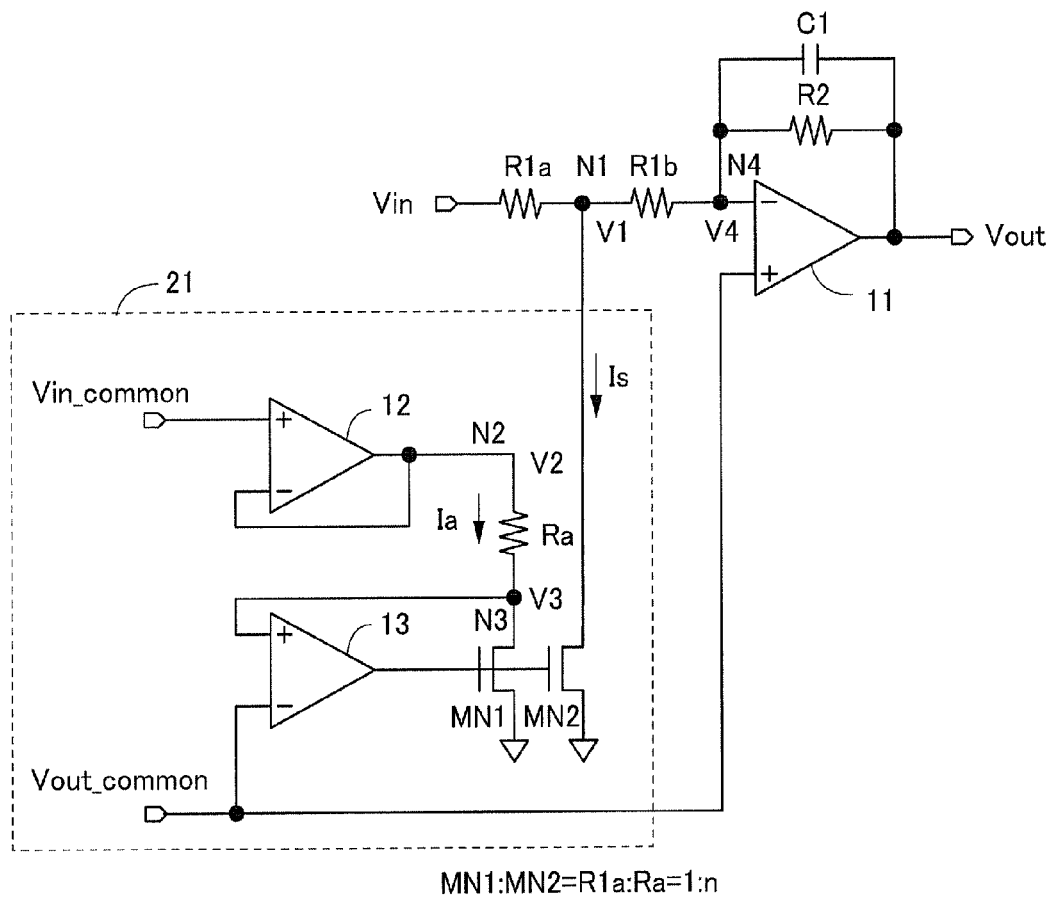
FIG. 2 shows a circuit diagram of a first exemplary linear amplifier.

FIG. 2 shows 1st exemplary linear amplifier according to this disclosure. The exemplary linear amplifier includes a current source 21 that generates the current Is shown in FIG. 1 based on a resistance Ra, the input common mode voltage Vin_common, and the output common mode voltage Vout_common.

The constant current source 21 includes two voltage amplifiers 12 and 13, two NMOS transistors MN1 and MN2 and the resistance Ra. The non-inverting input terminal of the voltage amplifier 12 receives the input common mode voltage Vin_common and the inverting input terminal thereof is connected to the output terminal thereof, which constitutes a node N2. The inverting input terminal of the voltage amplifier 13 receives the output common mode voltage Vout_common, the output terminal thereof is connected to the gate terminal of the transistor MN1, and the non-inverting input terminal thereof is connected to the drain terminal of the transistor MN1, which constitutes a node N3. The input and output common mode voltages Vin_common and Vout_common may be generated by dividing a reference voltage, which may be generated using a band gap reference device.

The resistance Ra is connected between the nodes N2 and N3 and a current Ia flows through the resistance Ra and further through the transistor MN1, which is connected in series with the resistance Ra. The transistors MN1 and MN2 construct a current mirror, and the current Ia is mirrored by the transistor MN2. Thereby, the current Is flows through the transistor MN2 whose drain is connected to the node N1. Here, dimensions of the transistors MN1 and MN2 and values of the resistances R1$a$ and Ra are set as MN1:MN2=R1$a$:Ra. That is, the ratio of dimensions of the transistors MN1 and MN2 is equal to the ratio of values of the resistances R1$a$ and Ra.

The voltage amplifier 12 operates as a voltage follower that output the input common mode voltage Vin_common to the node N2. Accordingly, the voltage V2 at the node N2 is set as follows.

$$V2 = Vin\_common$$

Similarly, the voltage amplifier 13 and the transistor MN1 operate as a voltage follower that outputs the output common mode voltage Vout_common to the node N3. Accordingly, the voltage V3 at the node N3 is set as follows.

$$V3 = Vout\_common$$

Thus, the current Ia that flows through the resistance Ra and the transistor MN1 is determined by the following equation.

$$Ia = (V2-V3)/Ra = (Vin\_common - Vout\_common)/Ra$$

When the ratio of dimensions of the transistors MN1 and MN2 is MN1:MN2=1:n, the current Is that flows through the transistor MN2 is determined by the following equation.

$$Is = n \cdot (Vin\_common - Vout\_common)/Ra$$

Because the voltage amplifier 11 controls the voltage V4 at the inverting input terminal thereof, which constituted the node N4, to Vout_common, no DC current flows through the resistance R2 when an average voltage, or DC voltage, V1 at the node V1 is set as follows.

$$V1 = Vout\_common$$

In this case, the entire current Is flows through the input resistance R1$a$. Accordingly, considering the relationship of R1$a$:R1=MN1:MN2=1:n, an average voltage of the input signal Vin is determined as follows.

$$\begin{aligned}Vin &= Vout\_common + Is \cdot R1a \\ &= Vout\_common + \\ &\quad (n \cdot (Vin\_common - Vout\_common)/Ra) \cdot (Ra/n) \\ &= Vin\_common\end{aligned}$$

That is, the exemplary linear amplifier shown in FIG. 2 accomplishes a level shift from an input signal Vin having the input common mode voltage Vin_common to an output signal Vout having the output common mode voltage Vout_common.

Specifically, the exemplary linear amplifier implements a level shift, or a level down, by connecting a constant current source 21 that draws current Is to the node N1 between the divided input resistances R1$a$ and R1$b$. When the level shift is properly implemented, the voltage amplifier 11 is not required to supply a surplus current.

When the exemplary linear amplifier is constructed in a semiconductor integrated circuit, the value of the input resistance R1$s$ may vary widely. The constant current source employed in the exemplary linear amplifier shown in FIG. 2 enables to keep the amount of level shift Voffset=Is·R1$a$ constant, even when the value of the input resistance R1$a$ varies.

The values of resistances R1$a$ and Ra integrated in the same semiconductor integrated circuit vary similarly even when the values deviate from their designed values due to influences of manufacturing conditions, operating temperature, and so on. Accordingly, the ratio between them is kept constant. As a result, by setting MN1:MN2=R1$a$:Ra as shown in FIG. 2, the following relationship can be maintained.

$$Voffset = Is \cdot R1a = Vin\_common - Vout\_common$$

Accordingly, the amount of level shift and the common mode voltage of the output signal can be determined precisely.

Assume that the voltage gain of the voltage amplifier 11 is sufficiently large and that the impedance of the transistor MN2 is sufficiently larger than the impedances of the resistances R1$a$, R1$b$, and R2. Then, a total gain of the exemplary linear amplifier Av may be approximated as follows.

$$Av = R2/(R1a + R1b)$$

Because the amount of level shift of the exemplary linear amplifier is determined only by the current Is of the constant current source 21 and the input resistance R1$a$, values of the resistances R1$b$ and R2 may be varied arbitrarily. Accordingly, the voltage gain of the exemplary linear amplifier may be set as desired while accomplishing a necessary amount of level shift.

Further, by connecting a capacitance C1 in parallel with the resistance R2, the exemplary linear amplifier may also oper ate as an active low-pass filter whose cut-off frequency is determined by the following equation.

$$fp=1/(2\pi \cdot R2 \cdot C1)$$

As explained above, the exemplary linear amplifier can realize functions of level shift, linear amplification or linear de-amplification, and removal of high-frequency components in a single stage. The smaller number of amplification stages reduces the degradation of signals. Moreover, power consumption and circuit area may be reduced. Various constructions of the voltage amplifiers 11, 12, and 13 may be acceptable as long as required stabilities and gains are provided.

2nd Exemplary Embodiment

A practical construction of the exemplary linear amplifier will be explained. Various parameters including the amount of level shift, the ratios of dimensions of transistors, the gain Av, the cut-off frequency fp may be set arbitrarily. In this exemplary embodiment, however, following parameters are assumed.

a level shift from a signal in 3.3 V supply voltage region to a signal in 1.2 V supply voltage region
  Vin_common=1.55 V
  Vout_common=636 mV, i.e., the amount of level shift=914 mV
  Av=−2 dB to 3 dB with a step of 1 dB
  fp=40 MHz In order to be applicable for practical applications, the exemplary linear amplifier is constructed as a differential linear amplifier. It is assumed that each of the voltage amplifiers has sufficient bandwidth, gain, and phase margin, although a detailed construction of the voltage amplifier is omitted.

Figure 3A:
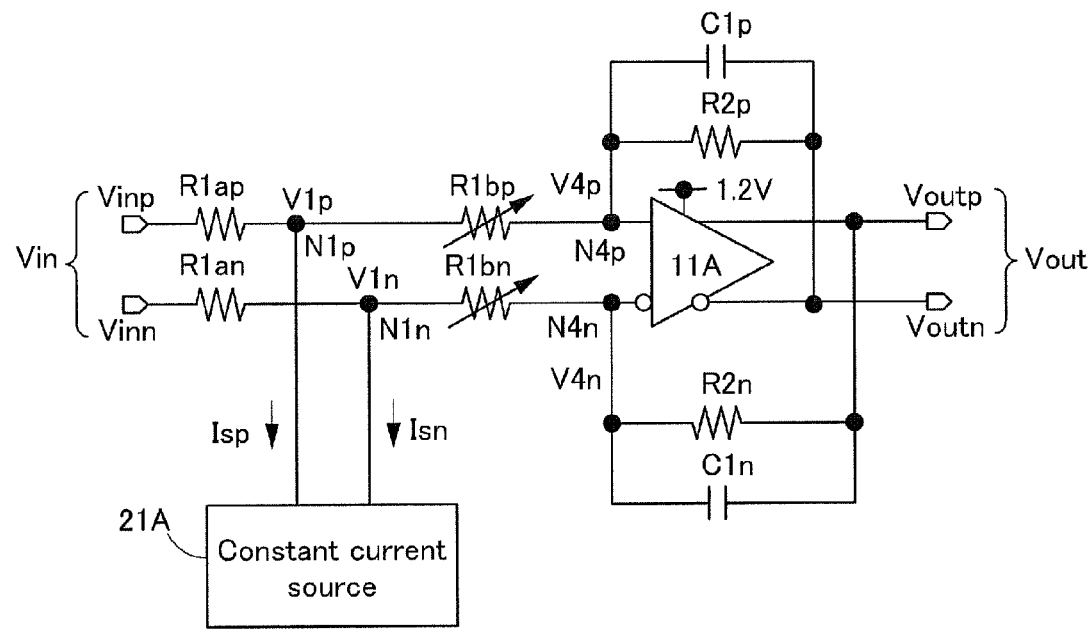
FIG. 3A shows a circuit diagram of a second exemplary linear amplifier.

FIG. 3A shows a construction of an exemplary linear amplifier that realizes the required functions. As a voltage amplifier, a differential input and differential output voltage amplifier 11A is employed. The differential input and differential output voltage amplifier 11A has a common mode feedback circuit and controls the DC level, or the common mode voltage, of the output signal Vout equal to Vout_common. As the differential input and differential output voltage amplifier having the common mode feedback circuit, amplifiers such as described in Japanese patent publication JP 2005-323287 and U.S. Pat. Nos. 7,528,659 and 7,750,737, which are incorporated by reference in their entireties, may be used.

For example, the common mode feedback circuit includes an error amplifier that compares an average voltage of voltages of the positive output signal Voutp and the negative output signal Voutn with the common mode voltage Vout_common. The average voltage may be detected using a resistive divider. In accordance with the result of comparison, the error amplifier may control the differential input and differential output voltage amplifier 11A such that the average voltage become equal to the output common mode voltage Vout_common. For example, the error amplifier may adjust one of a tail current and a load resistance of an input stage of the differential input and differential output amplifier.

Input resistances R1$ap$ and R1$bp$ are connected in series between a positive signal input terminal, which receives the positive input signal Vinp, and a node N4$p$ at the non-inverting input terminal of the differential amplifier 11A. Input resistances R1$an$ and R1$bn$ are connected in series between a negative signal input terminal, which receives the negative input signal Vinn, and a node N4$n$ at the inverting input terminal of the differential amplifier 11A. The value of the resistances R1$ap$ and R1$an$ is, for example, 500Ω. A feedback resistance R2$p$ and a feedback capacitance C1$p$, which are connected in parallel with each other, are connected between the node N4$p$ at the non-inverting input terminal and the inverting output terminal of the differential amplifier 11A. A feedback resistance R2$n$ and a feedback capacitance C1$n$, which are connected in parallel with each other, are connected between the node N4$n$ at the inverting input terminal and the non-inverting output terminal of the differential amplifier 11A.

A constant current source 21A draws current Isp from the node N1$p$ between the input resistances R1$ap$ and R1$bp$ and current Isn from the node N1$n$ between the input resistances R1$an$ and R1$bn$, respectively.

Figure 3C:
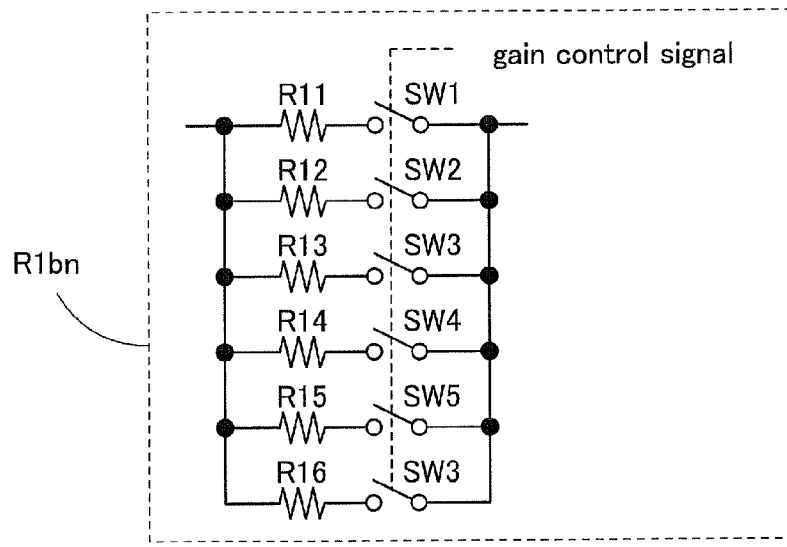
FIG. 3C shows a construction of an exemplary variable resistance that may be used in the exemplary linear amplifier shown in FIG. 3A.

As shown in FIG. 3C, the input resistance R1$bn$ is constructed as a variable resistance. Specifically, 6 resistances R11 through R16 with resistance values of R11=385Ω, R12=490Ω, R13=615Ω, R14=750Ω, R15=900Ω, and R16=1075Ω are connected through respective switches SW1 through SW6. A gain control signal controls the switches SW1 through SW6 to vary the resistance value of the input resistance R1$bn$. The same construction may be employed for the input resistance R1$bp$.

Figure 3B:
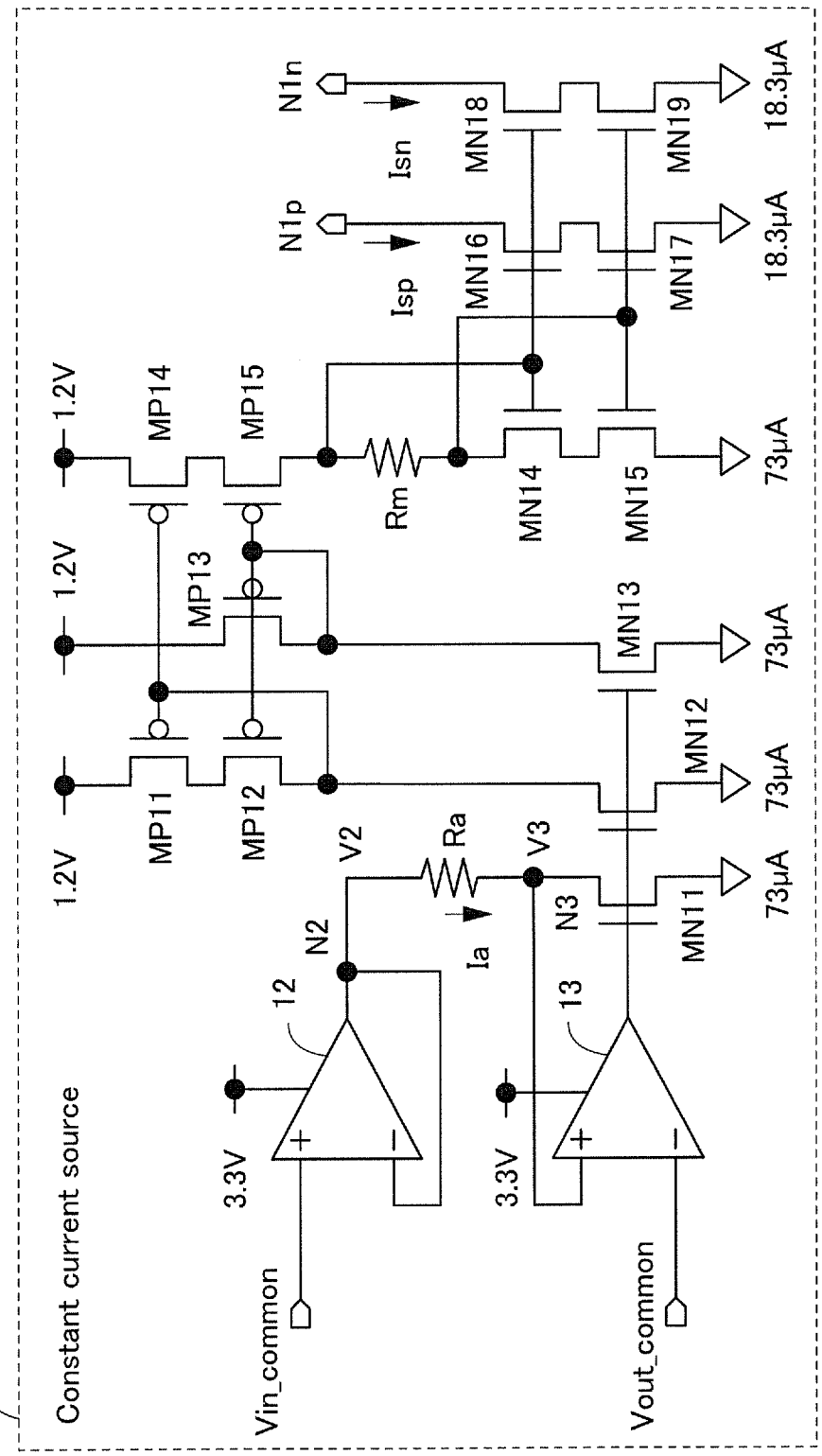
FIG. 3B shows a circuit diagram of an exemplary constant current source that may be used in the exemplary linear amplifier shown in FIG. 3A.

As shown in FIG. 3B, the constant current source 21A may be constructed with voltage amplifiers 12 and 13, resistances Ra and Rm, NMOS transistors MN11 through MN19, and PMOS transistors MP11 through MP15. The voltage amplifiers 12 and 13 are placed in the 3.3 V supply voltage region. The values of the resistances Ra and Rm may be 12.5 kΩ and 3 kΩ, respectively. Ratios of dimensions of the NMOS transistors may be set as follows.
MN11:MN12:MN13:MN14:MN15:MN16:MN17:MN18:MN19=2:2:2:2:2:50:50:50:50
Ratios of dimensions of the PMOS transistors may be set as follows.
MP11:MP12:MP13:MP14:MP15=8:8:2:8:8

Same as the constant current source 21 shown in FIG. 2, the voltage amplifier 12 receives the input common mode voltage Vin_common at the non-inverting input terminal thereof and operates as a voltage follower to set the voltage V2 at the node N2 equal to the input common mode voltage Vin_common. The voltage amplifier 13 receives the output common mode voltage Vout_common at the inverting input terminal thereof and operates as a voltage follower to set the voltage V3 at the node N3 equal to the output common mode voltage Vout_common. A current Ia=(Vin_common−Vout_common)/Ra flows through the resistance Ra connected between the nodes N2 and N3 and through the NMOS transistor MN11, which is connected in series with the resistance Ra.

The NMOS transistors MN12 through MN19 and PMOS transistor MP11 through MP15 construct a current mirror circuit, which is placed in the 1.2 V supply voltage region. The current mirror circuit employs cascaded constant current sources in order to increase impedances. In the constant current source 21A shown in FIG. 3B, the current Ia is generated from the common mode voltages Vin_common and Vout_common, which are buffered by voltage followers placed in the 3.3 V supply voltage region. And the current Ia is mirrored by the current mirror circuit placed in the 1.2 V supply voltage region. Thereby, currents Isp and Isn are generated.

The currents Isp and Isn, which are drawn from the nodes N1$p$ and N1$n$, respectively, may be adjusted by adjusting the mirror ratios. That is, the currents Isp and Isn may be adjusted to be inversely proportional to the ratios of the resistances R1$ap$ and R1$an$, respectively over the resistance Ra. Such adjustment makes amounts of IR drops across the resistances Ra, R1$ap$, and R1$an$ same with each other and equal to the amount of level shift, i.e., Vin_common−Vin_output.

As a result, when the differential voltage of the input signal Vin is 0 and the voltages of the positive and negative input signal Vinp and Vinn are equal to the common mode voltage of the input signal Vin_common, a voltage equal to the common mode voltage of the output signal Vout_common=636 mV is generated at the nodes N1$p$ and N1$n$. In other words, the common mode voltage of the differential input signal received at the positive and negative signal input terminals is shifted to the common mode voltage of the output signal Vout_common and input to the non-inverting and inverting input terminals of the differential amplifier through the input resistances R1$bp$ and R1$bn$, respectively.

Further, the common mode feedback circuit in the differential amplifier 11A adjusts the common mode voltage at the output terminals thereof equal to 636 mV. Thus, the common mode voltage of signals at the nodes N1$p$ and N1$n$ and following stages in the exemplary linear amplifier are set to 636 mV. Accordingly, the differential amplifier 11A stably operates with the supply voltage of 1.2 V.

It is required that the preceding stage, which outputs the differential input signal Vin, supplies the currents Isp and Isn that are drawn from the nodes N1$p$ and N1$n$. Alternatively, constant current sources that supply currents corresponding to Isp and Isn, respectively, may be connected to the signal input terminals that receive the differential signal Vinp and Vinn. In this case, it is not required to modify the preceding stage.

The gain of the level shift circuit may be variable by implementing the input resistances R1$bp$ and R1$bn$ as variable resistances. FIG. 3C shows an exemplary construction of the variable resistance that utilizes switches. Various other constructions of variable resistances may be employed. While FIG. 3A shows an example where only the input resistances R1$bp$ and R1$bn$ are variable, it is also possible to make one or both of the input resistances R1$ap$ and R1$an$ and the feedback resistances R2$p$ and R2$n$ variable. However, variation of the input resistances R1$ap$ and R1$an$ varies the amount of level shift. Variation of the feedback resistances R2$p$ and R2$n$ varies the cut-off frequency.

The construction shown in FIG. 3C enables to vary the total value of the input resistances, i.e., R1$ap$+R1$bp$ or R1$an$+R1$bn$, to 885 Ω, 990 Ω, 1115 Ω, 1250 Ω, 1400Ω, and 1574Ω. Thereby, the total gain Av of the linear amplifier may be varied with a step of 1 dB as 3 dB, 2 dB, 1 dB, 0 dB, −1 dB, and −2 dB.

Further, by connecting capacitances C1$p$ and C1$n$ in parallel with the feedback resistances R2$p$ and R2$n$, respectively, the exemplary linear amplifier may further functions as a low-pass filter. The cut-off frequency of the filter may be set to, for example, 40 MHz. That is, the gain of the exemplary linear amplifier drops by −3 dB at 40 MHz. The cut-off frequency may be set by selecting the value of the capacitances C1$p$ and C1$n$ such that the capacitances and the feedback resistances R2$p$ and R2$n$ produce a time-constant corresponding to the cut-off frequency.

3rd Exemplary Embodiment

Figure 4:
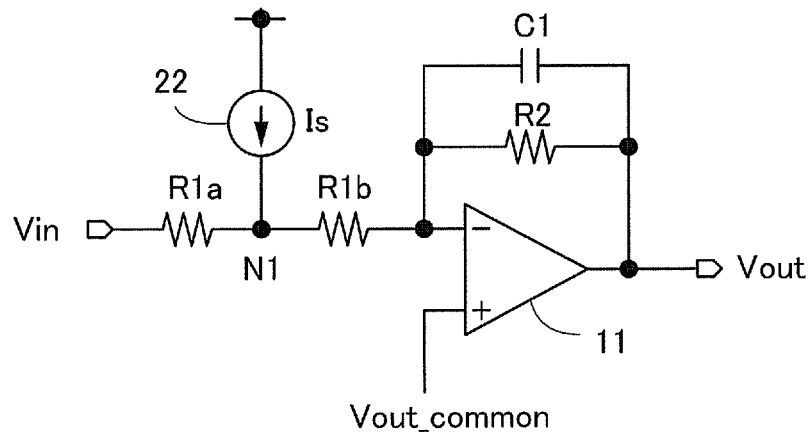
FIG. 4 shows a circuit diagram of a third exemplary linear amplifier.

The exemplary linear amplifier explained above performs a level shift from a signal in 3.3 V supply voltage region to a signal in 1.2 V supply voltage region. That is, the exemplary linear amplifier decreases the signal level. As shown in FIG. 4, however, it is also possible to increase the signal level.

The third exemplary linear amplifier shown in FIG. 4 has essentially the same construction as the linear amplifier shown in FIG. 1. Similar to the exemplary constant current source 21 shown in FIG. 2, the constant current source 22 used in the exemplary linear amplifier shown in FIG. 4 may generate a current Is from the common mode voltages Vin_common and Vout_common. Opposite to the constant current source 21 shown in FIG. 2, however, the constant current source 22 supplies the current Is to the node N1 such that the current Is flows through the input resistance R1$a$ toward the signal input terminal.

4th Exemplary Embodiment

In each of the exemplary linear amplifiers described above requires the current Is for the level shift. When the preceding stage has a constant current source as a load, for example, the current may be supplied from the constant current source. Thereby, power consumption and circuit area may be reduced.

Figure 5:
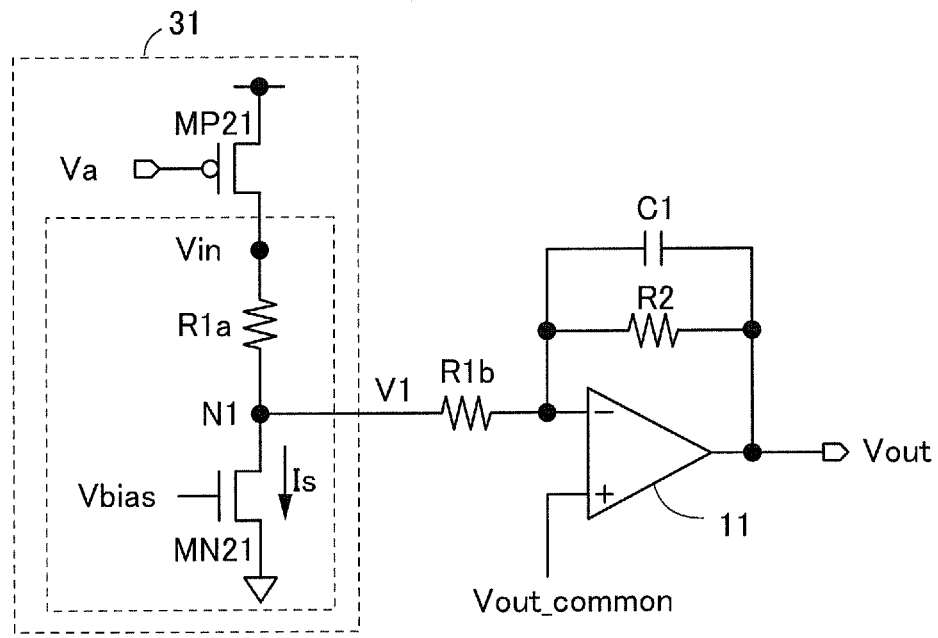
FIG. 5 shows a circuit diagram of a fourth exemplary linear amplifier.

FIG. 5 shows fourth exemplary linear amplifier that supplies the current Is from the constant current load. The preceding stage 31 is a source-grounded amplifier constructed with a PMOS transistor MP21. The preceding stage 31 further includes a combination of an NMOS transistor MN21 and a resistance R1$a$. The NMOS transistor MN21 constructs a constant current source that draws the current Is and functions as a load of the source-grounded amplifier.

The resistance R1$a$ functions as an input resistance R1$a$ of the level shift circuit. That is, a level of the signal Vin at the drain terminal of the source-grounded amplifier, which has a common mode voltage Vin_common, is shifted by an amount of Is·R1$a$ to have a common mode voltage Vout_common. Then, the shifted signal is input to the inverting input terminal of the voltage amplifier 11 through the resistance R1$b$.

While the invention of this disclosure has been described with reference to specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A linear amplifier comprising:
 a signal input terminal that receives an input signal having a first common mode voltage;
 a voltage amplifier having an inverting input terminal, a non-inverting input terminal to which a second common mode voltage is supplied, and an output terminal that outputs an output signal;
 a first and a second input resistance connected in series from the signal input terminal to the inverting input terminal of the voltage amplifier;
 a feedback resistance connected between the inverting input terminal and the output terminal of the voltage amplifier; and
 a constant current source that supplies a constant current to a middle node between the first and second input resistances, the constant current generates a voltage drop, which is equal to a difference between the first and second common mode voltages, across the signal input terminal and the middle node.

2. The linear amplifier according to claim 1, wherein the constant current source includes:
 a current generating resistance connected between the first and second common mode voltages to generate a source current; and
 a current mirror circuit that mirrors the source current to generate the constant current.

3. The linear amplifier according to claim 1, wherein the first input resistance is a fixed resistance and the second input resistance is a variable resistance.

4. The linear amplifier according to claim 1, further comprising a compensating current source that supplies the constant current to the signal input terminal.

5. The linear amplifier according to claim 1, wherein:
the input signal is a differential input signal and the signal input terminal includes a positive and a negative signal input terminal that receive the differential input signal;
the output signal is a differential output signal and the output terminal of the voltage amplifier includes a non-inverting and an inverting output terminal that outputs the differential output signal;
the first and second input resistances include a first and a second positive input resistance connected in series from the positive signal input terminal to the non-inverting input terminal of the voltage amplifier and a first and a second negative input resistance connected in series from the negative signal input terminal to the inverting input terminal of the voltage amplifier;
the feedback resistance includes a first feedback resistance connected between the inverting input terminal and the non-inverting output terminal of the voltage amplifier and a second feedback resistance connected between the non-inverting input terminal and the inverting output terminal of the voltage amplifier;
the constant current source supplies a first constant current to a first middle node between the first and second positive input resistances and a second constant current to a second middle node between the first and second negative input resistances, the first and second constant currents generate the voltage drop equal to the difference across the positive signal input terminal and the first middle node and across the negative signal input terminal and the second middle node,
wherein the second common mode voltage is generated at the first middle node and supplied to the non-inverting input terminal of the voltage amplifier through the second positive input resistance when a voltage of the positive input signal is equal to the first common mode voltage.

6. The linear amplifier according to claim 5, wherein the voltage amplifier has a common mode feedback circuit that controls a common mode voltage of the differential output signal equal to the second common mode voltage.

7. A linear amplifier comprising:
a positive and a negative signal input terminal that receive a differential input signal having a first common mode voltage;
a voltage amplifier having a non-inverting and an inverting input terminal, and a non-inverting and an inverting output terminal that output a differential output signal;
a first and a second positive input resistance connected in series from the positive signal input terminal to the non-inverting input terminal of the voltage amplifier and a first and a second negative input resistance connected in series from the negative signal input terminal to the inverting input terminal of the voltage amplifier;
a first feedback resistance connected between the inverting input terminal and the non-inverting output terminal of the voltage amplifier and a second feedback resistance connected between the non-inverting input terminal and the inverting output terminal of the voltage amplifier; and
a constant current source that supplies a first constant current to a first middle node between the first and second positive input resistances and a second constant current to a second middle node between the first and second negative input resistances so that a voltage drop, which is equal to a difference between the first common mode voltage and a second common mode voltage, is generated across the positive signal input terminal and the first middle node and across the negative input terminal and the second middle node.

8. The linear amplifier according to claim 7, wherein the voltage amplifier includes a common mode feedback circuit that controls a common mode voltage of the differential output signal equal to the second common mode voltage.

9. The linear amplifier according to claim 7, wherein the constant current source includes:
a current generating resistance connected between the first and second common mode voltages to generate a source current; and
a current mirror circuit that mirrors the source current to generate the first and second constant currents.

10. The linear amplifier according to claim 7, wherein the first positive and negative input resistances are fixed resistances and the second positive and negative input resistance are variable resistances.

11. A method of level shifting, comprising:
receiving an input signal having an input common mode voltage equal to a first common mode voltage at a signal input terminal;
inputting the input signal to an inverting input terminal of a voltage amplifier through a first and a second input resistance connected in series from the signal input terminal to the inverting input terminal;
supplying a second common mode voltage to a non-inverting input terminal of the voltage amplifier; outputting an output signal from an output terminal of the voltage amplifier;
feeding back the output signal to the inverting input terminal of the voltage amplifier through a feedback resistance; and
supplying a constant current to a middle node between the first and second input resistances to generate a voltage drop, which is equal to a difference between the first and second common mode voltages, across the signal input terminal and the middle node so that the input signal is input to the inverting input terminal of the voltage amplifier through the second input resistance after the input common mode voltage is shifted to the second common mode voltage.

12. The method according to claim 11, wherein the supplying of the constant current includes:
generating a source current by connecting a current generating resistance between the first and the second common mode voltages; and
mirroring the source current to generate the constant current.

13. The method according to claim 11, further comprising varying a ratio of amplitudes of the output signal and the input signal by varying the second input resistance without varying the first input resistance.

14. The method according to claim 11, wherein:
the receiving receives a differential input signal including a positive and a negative input signal at a positive and a negative signal input terminal, respectively;
the inputting inputs the positive input signal to the non-inverting input terminal of the voltage amplifier through a first and a second positive input resistance connected in series from the positive signal input terminal to the non-inverting input terminal and the negative input signal to the inverting input terminal of the voltage amplifier through a first and a second negative input resistance connected in series from the negative signal input terminal to the inverting input terminal;

the outputting outputs a differential output signal including a positive and a negative output signal from a non-inverting and an inverting output terminal, respectively, of the voltage amplifier;

the feeding back feeds back the positive output signal to the inverting input terminal of the voltage amplifier through a first feedback resistance and the negative output signal to the non-inverting input terminal of the voltage amplifier through a second feedback resistance;

the supplying of the constant current supplies a first constant current to a first middle node between the first and second positive input resistances and a second constant current to a second middle node between the first and second negative input resistances; and the generating generates the voltage drop equal to the difference across the positive signal input terminal and the first middle node and across the negative input terminal and the second middle node so that the supplying of the second common mode voltage to the non-inverting input terminal of the voltage amplifier is performed by inputting the positive input signal to the non-inverting input terminal through the second positive input resistance after the input common mode voltage is shifted to the second common mode voltage.

15. The method according to claim 14, wherein the voltage amplifier includes a common mode feedback circuit that controls a common mode voltage of the differential output signal equal to the second common mode voltage.

16. A method of level shifting, comprising:
receiving a differential input signal including a positive and a negative input signal, which has an input common mode voltage equal to a first common mode voltage, at a positive and a negative signal input terminal, respectively;

inputting the positive input signal to a non-inverting input terminal of a voltage amplifier through a first and a second positive input resistance connected in series from the positive signal input terminal to the non-inverting input terminal and the negative input signal to an inverting input terminal of the voltage amplifier through a first and a second negative input resistance connected in series from the negative signal input terminal to the inverting input terminal;

outputting a differential output signal including a positive and a negative output signal from a non-inverting and an inverting output terminal, respectively, of the voltage amplifier, feeding back the positive output signal to the inverting input terminal of the voltage amplifier through a first feedback resistance and the negative output signal to the non-inverting input terminal of the voltage amplifier through a second feedback resistance;

supplying a first constant current to a first middle node between the first and second positive resistances and a second constant current to a second middle node between the first and second negative resistances; and generating a voltage drop, which is equal to a difference between the first common mode voltage and a second common mode voltage, across the positive signal input terminal and the first middle node and across the negative signal input terminal and the second middle node so that the positive and negative input signals are input to the non-inverting and inverting input terminals of the voltage amplifier through the second positive and second negative input resistances, respectively, after the input common mode voltage is shifted to the second common mode voltage.

17. The method according to claim 16, wherein the supplying of the first and second constant currents includes:
generating a source current by connecting a current generating resistance between the first and the second common mode voltages; and
mirroring the source current to generate the first and second constant currents.

18. The method according to claim 16, further comprising varying a ratio of amplitudes of the output signal and the input signal by varying the second positive and negative input resistances without varying the first positive and negative input resistances.

19. The method according to claim 16, wherein the voltage amplifier includes a common mode feedback circuit that controls a common mode voltage of the differential output signal equal to the second common mode voltage.

* * * * *